United States Patent
Fainzilber et al.

(10) Patent No.: US 10,742,237 B2
(45) Date of Patent: Aug. 11, 2020

(54) MEMORY DEVICE WITH ADAPTIVE DESCRAMBLING

(71) Applicant: Western Digital Technologies, Inc., San Jose, CA (US)

(72) Inventors: Omer Fainzilber, Kfar Saba (IL); Eran Sharon, Kfar Saba (IL); Alex Bazarsky, Kfar Saba (IL); Dudy David Avraham, Kfar Saba (IL); Idan Alrod, Kfar Saba (IL)

(73) Assignee: Western Digital Technologies, Inc., San Jose, CA (US)

(*) Notice: Subject to any disclaimer, the term of this patent is extended or adjusted under 35 U.S.C. 154(b) by 100 days.

(21) Appl. No.: 16/014,128

(22) Filed: Jun. 21, 2018

(65) Prior Publication Data
US 2019/0393901 A1 Dec. 26, 2019

(51) Int. Cl.
H03M 13/35 (2006.01)
H03M 13/37 (2006.01)
H04L 25/03 (2006.01)
H04L 12/70 (2013.01)

(52) U.S. Cl.
CPC ........... *H03M 13/35* (2013.01); *H03M 13/37* (2013.01); *H04L 25/03866* (2013.01); *H04L 25/03872* (2013.01); *H04L 2012/5672* (2013.01); *H04L 2012/5673* (2013.01)

(58) Field of Classification Search
CPC . H03M 13/35; H03M 13/37; H04L 25/03866; H04L 25/03872; H04L 2012/5672; H04L 2012/5673

USPC ................................ 714/774, 773, 768, 763
See application file for complete search history.

(56) References Cited

U.S. PATENT DOCUMENTS

| | | | |
|---|---|---|---|
| 7,099,473 B2* | 8/2006 | Maeda | H04N 7/1675 348/E7.056 |
| 7,233,612 B1* | 6/2007 | Zhang | H03M 13/27 375/130 |
| 7,330,320 B1* | 2/2008 | Oberg | G11B 20/10009 360/25 |
| 8,261,159 B1* | 9/2012 | Sommer | G06F 11/1048 713/193 |
| 8,276,052 B1 | 9/2012 | Riani et al. | |
| 8,578,243 B2* | 11/2013 | Sommer | G06F 11/1048 713/193 |
| 8,713,330 B1* | 4/2014 | Sommer | G06F 11/1048 713/193 |
| 9,086,456 B2* | 7/2015 | Yen | G01R 31/31853 |
| 9,195,537 B2* | 11/2015 | Sharon | G06F 11/1048 |
| 9,436,549 B2* | 9/2016 | Tuers | H03M 13/1111 |
| 2001/0033660 A1* | 10/2001 | Maeda | H04N 7/1675 380/232 |
| 2005/0180571 A1* | 8/2005 | Chang | H03M 7/30 380/269 |
| 2005/0246372 A1* | 11/2005 | Yamaki | G11B 20/00086 |

(Continued)

*Primary Examiner* — John J Tabone, Jr.
(74) *Attorney, Agent, or Firm* — Vierra Magen Marcus LLP

(57) ABSTRACT

Disclosed herein is a memory device and a method of descrambling and decoding encoded data. In one aspect, encoded data is received. A scrambling seed is obtained from the encoded data prior to decoding the encoded data. The encoded data is descrambled according to the scrambling seed, and the descrambled data is decoded. The descrambled data may be decoded according to statistics of the descrambled data.

21 Claims, 10 Drawing Sheets

(56) References Cited

U.S. PATENT DOCUMENTS

| | | | |
|---|---|---|---|
| 2006/0140490 A1* | 6/2006 | Balasubramanian | ........................ H04N 19/176 382/232 |
| 2007/0081730 A1* | 4/2007 | Arakawa | ............... H04N 19/467 382/232 |
| 2007/0217608 A1* | 9/2007 | Shimasaki | ............... G06F 21/72 380/228 |
| 2009/0323942 A1* | 12/2009 | Sharon | ................. G11C 7/1006 380/44 |
| 2012/0237036 A1* | 9/2012 | Dabak | ................. H05K 5/0278 380/287 |
| 2012/0278687 A1* | 11/2012 | Sharon | ................ G06F 11/1048 714/790 |
| 2013/0101111 A1* | 4/2013 | Sharon | ............... G11B 20/0021 380/28 |
| 2014/0362990 A1* | 12/2014 | Kim | ................. H04L 25/03872 380/268 |
| 2015/0012788 A1* | 1/2015 | Yen | ................. G01R 31/31853 714/726 |
| 2015/0016426 A1* | 1/2015 | Merlin | ............. H04W 72/0466 370/335 |
| 2016/0034353 A1* | 2/2016 | Tuers | ................ H03M 13/1111 714/764 |
| 2016/0374037 A1* | 12/2016 | Lee | ....................... H04W 12/10 |
| 2017/0169255 A1* | 6/2017 | Lin | ........................ G06F 12/14 |
| 2018/0196712 A1* | 7/2018 | Kim | .................... G06F 11/1044 |
| 2019/0179543 A1* | 6/2019 | Sharon | .................... G06F 12/14 |
| 2019/0179772 A1* | 6/2019 | Ilani | ........................ G06F 21/79 |

* cited by examiner

MEMORY DEVICE WITH ADAPTIVE DESCRAMBLING

BACKGROUND

The following description is provided to assist the understanding of the reader. None of the information provided or references cited are admitted to be prior art.

Memory device stores electronic data. For writing data, some memory device scrambles the electronic data, and encodes the scrambled data to store the electronic data. Scrambling may be applied to distribute hardware (e.g., memory cells, channels, etc.) usage, and encoding may be applied to perform error correction coding (ECC) or data recovery. In one approach, the memory device receives electronic data, generates a scrambling seed, for example, through a random function or a random number generator, applies the scrambling seed to a sequence generator (e.g., linear feedback shift register) to obtain a scrambling sequence, and scrambles the electronic data by applying XOR operation on the electronic data and the scrambling sequence. The memory device may also encode the scrambled data and the scrambling seed, and store the encoded data in memory cells.

Reading stored data involves decoding the stored data, and descrambling the decoded data. In one approach, encoded data is decoded and scrambling seed is obtained from the decoded data. A descrambling may be performed on the decoded data based on the scrambling seed. In some cases, the scrambling seed obtained from the decoded data may have errors, thus subsequent descrambling performed based on the incorrect scrambling seed may render incorrect data read.

SUMMARY

Various embodiments disclosed herein are related to a device for decoding data. The device includes a receiver configured to receive encoded data. The device further includes an adaptive decoding controller configured to obtain a scrambling seed from the encoded data, and descramble the encoded data using the scrambling seed. The device further includes a decoder configured to decode the descrambled data.

In one or more embodiments, the adaptive decoding controller is configured to obtain the scrambling seed directly from the encoded data without decoding the encoded data.

In one or more embodiments, the adaptive decoding controller is configured to obtain statistics of the descrambled data. The decoder may be configured to decode the descrambled data based on the statistics of the descrambled data.

In one or more embodiments, the adaptive decoding controller is further configured to evaluate the scrambling seed based on one or more metrics. The one or more metrics may include entropy of descrambled data. The adaptive decoding controller may be further configured to select the scrambling seed based on an evaluation of the one or more metrics.

In one or more embodiments, the adaptive decoding controller is configured to obtain a first candidate scrambling seed and a second candidate scrambling seed from the encoded data. The scrambling seed may be one of the first candidate scrambling seed and the second candidate scrambling seed. The adaptive decoding controller may be further configured to descramble the encoded data based on the first candidate scrambling seed to obtain first descrambled data, and descramble the encoded data based on the second candidate scrambling seed to obtain second descrambled data.

In one or more embodiments, the adaptive decoding controller is configured to compare the first descrambled data and the second descrambled data and select one of the first candidate scrambling seed and the second candidate scrambling seed as the scrambling seed based on the comparison.

In one or more embodiments, the adaptive decoding controller is configured to obtain a first entropy of the first descrambled data, obtain a second entropy of the second descrambled data, compare the first entropy and the second entropy, and select the one of the first candidate scrambling seed and the second candidate scrambling seed rendering the descrambled data having a lower entropy as the scrambling seed.

Various embodiments disclosed herein are related to a system for decoding. The system includes an extraction circuit configured to extract a scrambling key from encoded data. The scrambling key indicates a candidate scrambling sequence for scrambling of data in the encoded data. The system further includes a descrambling circuit configured to descramble the encoded data. The system further includes an entropy analysis circuit coupled to the descrambling circuit. The entropy analysis circuit is configured to obtain entropy of the descrambled data. The system further includes a scrambling seed evaluation circuit coupled to the entropy analysis circuit. The scrambling seed evaluation circuit is configured to evaluate the scrambling key indicating the candidate scrambling sequence of scrambling of data in the encoded data according to the entropy of the descrambled data to determine an effectiveness of the scrambling key. The system further includes a decoding circuit coupled to the scrambling seed evaluation circuit. The decoding circuit is configured to decode the descrambled data based on the determined scrambling key.

In one or more embodiments, the extraction circuit is configured to extract the scrambling key located at a predetermined location in the encoded data.

In one or more embodiments, the extraction circuit is configured to obtain the scrambling key by changing one or more bits of another candidate scrambling key.

In one or more embodiments, the scrambling seed evaluation circuit is further configured to determine whether the entropy of the descrambled data satisfies a threshold entropy. In response to determining that the entropy of the descrambled data satisfies the threshold entropy, the entropy analysis circuit may be further configured to update the entropy of the descrambled data to be the threshold entropy. The extraction circuit may be further configured to obtain another scrambling key.

In one or more embodiments, the scrambling seed evaluation circuit is configured to determine whether the entropy of the descrambled data satisfies a threshold entropy. The extraction circuit may be further configured to obtain another scrambling key, in response to detecting the entropy of the descrambled data does not satisfy the threshold entropy.

In one or more embodiments, the decoding circuit is further configured to decode the descrambled data, in response to the scrambling seed evaluation circuit determining that the descrambled data descrambled according to the scrambling key has a lowest entropy from a set of descrambled data descrambled according to a plurality of scrambling keys.

Various embodiments disclosed herein are related to a system for reading stored data. The system includes a plurality of memory cells storing encoded data. The system further includes a memory interface circuit coupled to the plurality of memory cells. The memory interface circuit includes a receiver coupled to the plurality of memory cells. The receiver is configured to receive the encoded data from the plurality of memory cells. The memory interface circuit further includes an adaptive decoding controller coupled to the receiver. The adaptive decoding controller is configured to select, from a plurality of candidate scrambling seeds, a scrambling seed rendering descrambled data having a lower entropy, and descramble the encoded data according to the selected scrambling seed. The memory interface circuit further includes a decoder configured to decode the descrambled data.

In one or more embodiments, the adaptive decoding controller includes a statistics analyzer coupled to the descrambler. The statistics analyzer may be configured to determine statistics of the descrambled data. The decoder may be configured to decode the descrambled data according to the determined statistics of the descrambled data.

In one or more embodiments, the plurality of candidate scrambling seeds include at least a first candidate scrambling seed and a second candidate scrambling seed. The adaptive decoding controller includes a scrambling seed extractor coupled to the receiver. The scrambling seed extractor may be configured to extract a first candidate scrambling seed located at a predetermined location in the encoded data, and obtain a second candidate scrambling seed by changing one or more bits of the first candidate scrambling seed.

In one or more embodiments, the adaptive decoding controller includes a scrambling seed extractor coupled to the receiver. The scrambling seed extractor may be configured to obtain a first candidate scrambling seed and a second candidate scrambling seed from the encoded data of the plurality of candidate scrambling seeds. The adaptive decoding controller may include a descrambler coupled to the scrambling seed extractor. The descrambler may be configured to descramble the encoded data based on the first candidate scrambling seed to obtain first descrambled data, and descramble the encoded data based on the second candidate scrambling seed to obtain second descrambled data.

Various embodiments disclosed herein are related to a method of decoding data. The method includes extracting a scrambling seed from encoded data prior to decoding the encoded data. The method further includes descrambling the encoded data according to the scrambling seed. The method further includes obtaining statistics of the descrambled data. The method further includes decoding the descrambled data according to the statistics of the descrambled data.

In one or more embodiments, the method further includes descrambling the encoded data based on a first candidate scrambling seed to obtain a first descrambled data. The method may further include descrambling the encoded data based on a second candidate scrambling seed to obtain a second descrambled data. The method may further include comparing the first descrambled data and the second descrambled data. The method may further include selecting one of the first candidate scrambling seed and the second candidate scrambling seed as the scrambling seed based on the comparison.

Figure 1:
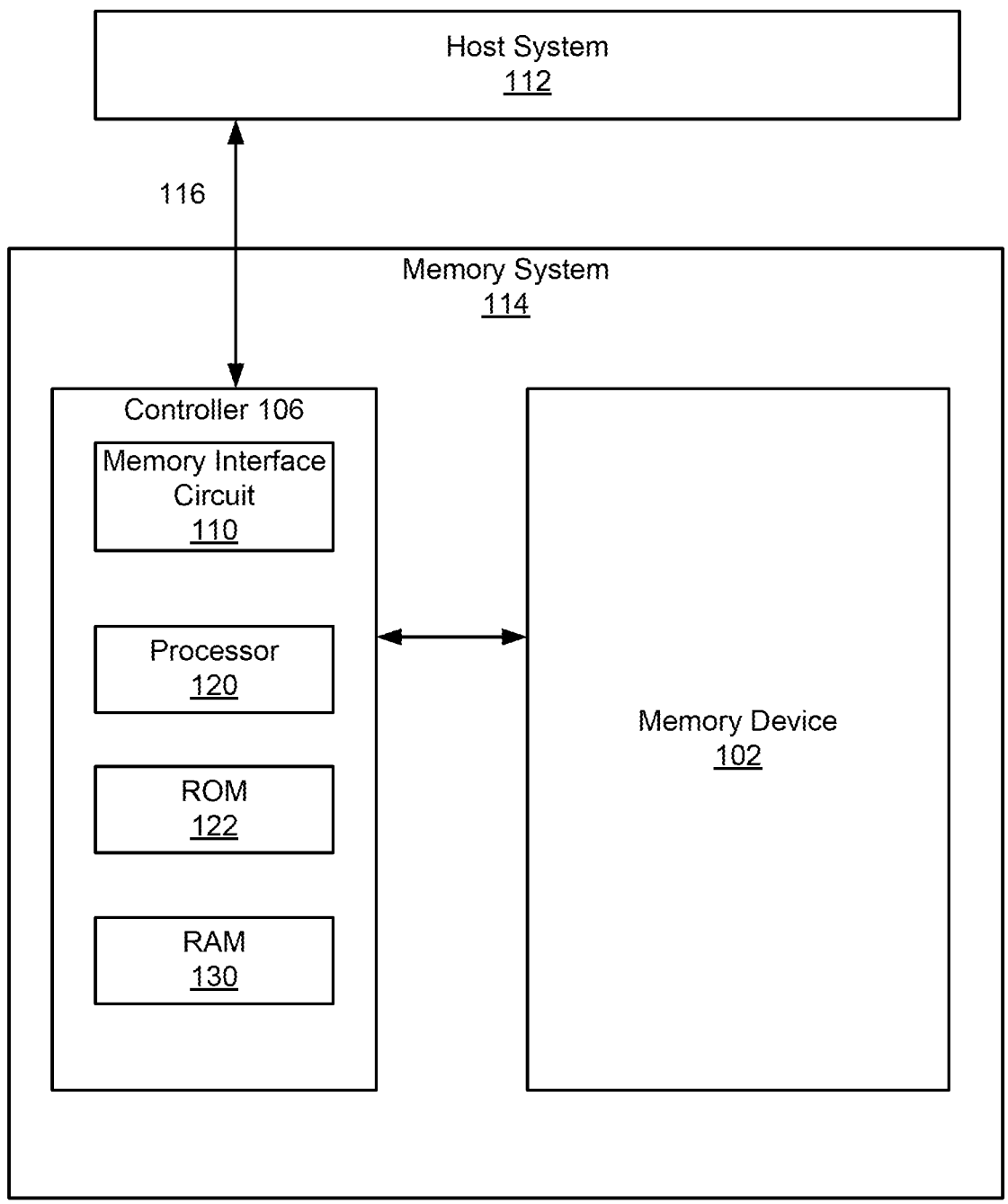
FIG. 1 is a block diagram of a computer system according to an example embodiment.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Disclosed herein are a method and a system for adaptively extracting a scrambling seed (also referred to herein as a scrambling key) to perform descrambling of encoded data, descrambling the encoded data according to the extracted scrambling seed, and decoding the descrambled data.

In one aspect, a scrambling seed for performing descrambling is directly obtained from the encoded data without decoding the encoded data. A scrambling seed may be any data structure for descrambling that is indicative of a scrambling sequence for scrambling data. Example of a scrambling seed may include a scrambling key, a scrambling data structure, a scrambling structure, etc. The scrambling seed may be selected from a plurality of candidate scrambling seeds. A candidate scrambling seed may be any scrambling seed that may have been applied for scrambling data and is being considered as the applied scrambling seed. A candidate scrambling seed may be obtained from a portion of encoded data at a predetermined location. In addition, a candidate scrambling seed may be obtained by varying one or more bits of another candidate scrambling seed. In some embodiments, different candidate scrambling seeds are evaluated, and a candidate scrambling seed rendering better descrambling (e.g., as shown by a statistical analysis demonstrating lower entropy) is selected as the scrambling seed. High entropy may be indicative of high randomness of data, where low entropy may be indicative of low randomness (or a strong pattern) of the data. For example, a statistic of descrambled data that is obtained by descrambling the encoded data according to a first candidate scrambling seed is compared against a statistic of descrambled data that is obtained by descrambling the encoded data according to a second candidate scrambling seed. By selecting a scrambling seed from a plurality of candidate scrambling seeds through statistical analysis, a scrambling seed may be extracted from the encoded data prior to decoding the encoded data. Decoding herein refers to converting data in encoded form into a decoded form. Examples of decoding include ECC decoding or error correction decoding.

Advantageously, by obtaining a scrambling seed from the encoded data without decoding the encoded data, subsequent decoding may be performed in an efficient manner. In one example, electronic data is scrambled according to a scrambling seed, and the scrambled data and the scrambling seed are encoded together for writing data. For reading data, decoding may be performed prior to descrambling, such that a scrambling seed may be obtained from the decoded data and descrambling may be performed on the decoded data based on the scrambling seed. However, decoding the encoded data prior to descrambling may introduce errors, and subsequently obtained scrambling seed may be subject to errors. In one or more embodiments disclosed herein, a scrambling seed is obtained from the encoded data prior to decoding the encoded data, such that a particular pattern or statistics of a descrambled data may be obtained. In addition, content aware decoding may be performed based on the obtained pattern or statistics. Hence, an error rate of descrambling and decoding can be reduced by descrambling the encode data prior to decoding as disclosed herein, compared to decoding the encoded data prior to descrambling.

FIG. 1 is a block diagram of a computer system 100, according to an example embodiment. The computer system 100 includes a memory system 114 operating according to commands from a host system 112. The computer system 100 can be any electronic device such as a personal computer, a server computer, a laptop, a smart phone, a tablet computer, a smart watch, etc. The memory system 114 communicates with the host system 112 through a host interface 116. The memory system 114 may be in the form of a removable memory such as a memory card, or may be in the form of an embedded memory system.

The memory system 114 includes a memory device 102 and a controller 106. The controller 106 is a circuit that controls operations of the memory device 102, according to commands from the host system 112. The memory device 102 comprises one or more arrays of memory cells distributed over one or more integrated circuit chips.

The memory device 102 is a hardware component that stores electronic data. In one aspect, the memory device 102 is embodied as a semiconductor memory device including one or more volatile memory devices, such as dynamic random access memory (DRAM) or static random access memory (SRAM) devices, non-volatile memory devices, such as resistive random access memory (ReRAM), electrically erasable programmable read only memory (EEPROM), flash memory (which can also be considered a subset of EEPROM), ferroelectric random access memory (FRAM), and magnetoresistive random access memory (MRAM), other semiconductor elements capable of storing information, or some combination of them.

The memory device 102 can be formed from passive and/or active elements, in any combinations and may include a plurality of memory cells. In a non-limiting example, passive semiconductor memory elements include ReRAM device elements, which in some embodiments include a resistivity switching storage element, such as an anti-fuse, phase change material, etc., and optionally a steering element, such as a diode, etc. Further, in another non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. In a non-limiting example, flash memory devices in a NAND configuration (NAND memory) may contain memory elements connected in series. The NAND memory array may be configured so that the array includes one or more memory strings in which a string includes multiple memory elements that share a single bit line. Alternatively, memory elements may be configured so that each element is individually accessible, e.g., a NOR memory array. NAND and NOR memory configurations are exemplary, and memory elements may be configured otherwise.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

In a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

In a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry may be implemented for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It will be recognized that the following is not limited to the two dimensional and three dimensional exemplary structures described but covers all relevant memory structures within the spirit and scope as described herein.

The controller 106 controls operations of the memory device 102. In one embodiment, the controller 106 includes a memory interface circuit 110, a processor 120, read-only-memory (ROM) 122, and random access memory (RAM) 130. In one aspect, ROM 122, RAM 130, or a combination of them constitute a non-transitory computer readable medium that stores instructions when executed by the processor 120 cause the processor 120 to perform various functions disclosed herein. These components may be embodied as an application specific integrated circuit, field programmable gate array, other controller embodiments known to those of ordinary skill in the art, or a combination of one or more of these implementations.

The memory interface circuit 110 is a circuit that interfaces between the host system 112 and the memory device 102. In one configuration, the memory interface circuit 110 is coupled between the host system 112 and the memory device 102. In this configuration, the memory interface circuit 110 stores data at the memory device 102 or reads data from the memory device 102, according to a request from the host system 112.

For storing data, in response to a request from the host system 112 to store data, the memory interface circuit 110 stores the data at the memory device 102. The memory interface circuit 110 may generate a scrambling seed for scrambling the data. The memory interface circuit 110 may randomly generate the scrambling data to store data. The memory interface circuit 110 may scramble the data according to the scrambling seed, encode the scrambled data, and store the encoded data at the memory device 102.

For reading data, in response to a request from the host system 112 to read data, the memory interface 110 retrieves the stored data from the memory device 102 and provides the retrieved data to the host system 112. The memory interface circuit 110 may adaptively descramble the encoded data stored by extracting a scrambling seed from the encoded data prior to decoding, and by descrambling the encoded data according to the extracted scrambling seed. The memory interface circuit 110 may decode the descrambled data, and provide the decoded data to the host system 112. Detailed configurations and operations of the memory interface circuit 110 are provided below with respect to FIGS. 2 through 6.

Figure 2:
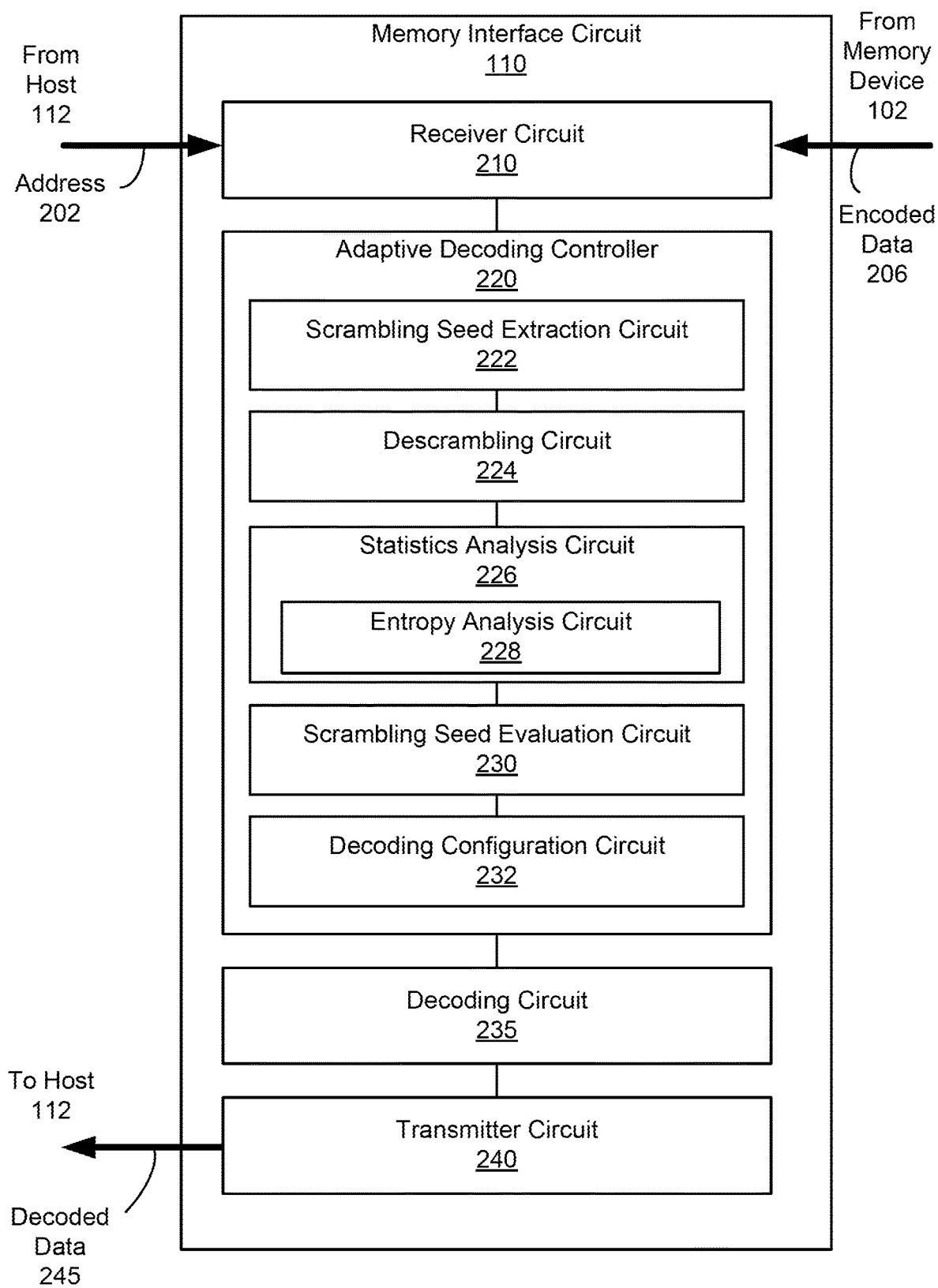
FIG. 2 is a memory interface circuit including an adaptive decoding controller, according to an example embodiment.

FIG. 2 is a memory interface circuit 110 including an adaptive decoding controller, according to an example embodiment. In one embodiment, the memory interface circuit 110 includes a receiver circuit 210, an adaptive decoding controller 220, a decoding circuit 235, and a transmitter circuit 240. These components operate together to read data stored by the memory device 102. These components may be embodied as application specific integrated circuit (ASIC), a field programmable gate array (FPGA), or a combination of them. In other embodiments, the memory interface circuit 110 includes more, fewer, or different components than shown in FIG. 2.

The receiver circuit 210 may be any circuit configured to receive data stored by one or memory cells. In one configuration, the receiver circuit 210 is coupled to a plurality of memory cells of the memory device 102. In other embodiments, a receiver may be utilized in place of the receiver circuit 210. As used herein, a receiver may comprise any component, logic, circuit, or the like configured to receive data stored by one or more cells. In one embodiment, the receiver includes the receiver circuit 210. In another embodiment, two or more components may cooperate to serve as a receiver. The receiver circuit 210 receives (i) an address signal 202 specifying one or more memory cells from the plurality of memory cells and (ii) a request to read data stored by the one or more memory cells. The receiver circuit 210 retrieves encoded data 206 stored by the one or more memory cells specified by the address signal 202.

The adaptive decoding controller 220 is any circuit configured to adaptively descramble the encoded data 206 to generate decoding configuration data. In one configuration, the adaptive decoding controller 220 is coupled to the receiver circuit 210. The adaptive decoding controller 220 receives the encoded data 206 from the receiver circuit 210, and adaptively descrambles the encoded data 206. In one aspect, the adaptive decoding controller 220 extracts a scrambling key for descrambling (e.g., a scrambling seed) from the encoded data 206 without decoding the encoded data 206, and descrambles the encoded data 206. In one approach, the adaptive decoding controller 220 selects a scrambling key (e.g., a scrambling seed) from a plurality of candidate scrambling keys (e.g. candidate scrambling seeds). A candidate scrambling key may be obtained from a portion of encoded data 206 at a predetermined location or by varying one or more bits of another scrambling key (e.g., another candidate scrambling seed). The adaptive decoding controller 220 may evaluate different candidate scrambling keys by comparing statistics of different descrambled data that are obtained by descrambling the encoded data 206 according to different candidate scrambling keys, and select a candidate scrambling key rendering a better descrambling (or lower entropy). Statistics of descrambled data associated with a scrambling key indicate an effectiveness of the scrambling key. Examples of the statistics include an entropy of the descrambled data, a pattern of bytes of descrambled data, etc. The adaptive decoding controller 220 may generate decoding configuration data according to statistics of the descrambled data associated with the selected scrambling key. The decoding configuration data is data including parameters for performing decoding by the decoding circuit 235. Examples of parameters for performing decoding include a sampling rate, a symbol rate, a particular type of encoding/decoding scheme, etc. The adaptive decoding controller 220 may provide the descrambled data and the decoding configuration data to the decoding circuit 235.

The decoding circuit 235 is any circuit configured to perform decoding according to decoding configuration data from the adaptive decoding controller 220. In one configuration, the decoding circuit 235 is coupled to the adaptive decoding controller 220. In other embodiments, a decoder may be utilized in place of the decoding circuit 235. As used herein, a decoder may comprise any component, logic, circuit, or the like configured to perform decoding according to the decoding configuration data. In one embodiment, the decoder includes the decoding circuit 235. In another embodiment, two or more components may cooperate to serve as a decoder. The decoding circuit 235 receives the descrambled data and the decoding configuration data from the adaptive decoding controller 220, and decodes the descrambled data according to the decoding configuration data. In some embodiments, the decoding circuit 235 is a means for decoding the descrambled data according to the statistics of the descrambled data. In one aspect, the decoding configuration data is indicative of statistics of the descrambled data, where the statistics are correlated to content or a type of data encoded. Hence, the decoding circuit 235 may decode the descrambled data according to the statistics of the descrambled data. Moreover, the decoding circuit 235 may perform content aware decoding by decoding the descrambled data according to the decoding configuration data.

The transmitter circuit 240 is any circuit configured to transmit decoded data to the host 112. In one configuration, the transmitter circuit 240 is coupled to the decoding circuit 235. In other embodiments, a transmitter may be utilized in place of the transmitter circuit 240. As used herein, a transmitter may comprise any component, logic, circuit, or the like configured to transmit decoded data to the host 112. In one embodiment, the transmitter includes the transmitter circuit 240. In another embodiment, two or more components may cooperate to serve as a transmitter. The transmitter circuit 240 receives the decoded data from the transmitter circuit 240, and transmits the decoded data 245 to the host 112.

Still referring to FIG. 2, the adaptive decoding controller 220 evaluates a plurality of candidate scrambling keys (e.g., candidate scrambling seeds), and selects a scrambling key (e.g., a scrambling seed) based on the evaluation. In one embodiment, the adaptive decoding controller 220 includes a scrambling seed extraction circuit 222, a descrambling circuit 224, a statistics analysis circuit 226, a scrambling seed evaluation circuit 230, and a decoding configuration circuit 232. These components operate together to extract a scrambling key from the encoded data 206 without decoding the encoded data 206, and descramble the encoded data according to scrambling key. In other embodiments, the adaptive decoding controller 220 includes more, fewer, or different components than shown in FIG. 2.

The scrambling seed extraction circuit 222 is a circuit that obtains candidate scrambling seeds. The scrambling seed extraction circuit 222 is coupled to memory cells of the memory device 102. In other embodiments, a scrambling seed extractor may be utilized in place of the scrambling seed extraction circuit 222. As used herein, a scrambling seed extractor may comprise any component, logic, circuit, or the like configured to obtain candidate scrambling seeds. In one embodiment, the scrambling seed extractor includes the scrambling seed extraction circuit 222. In another embodiment, two or more components may cooperate to serve as a scrambling seed extractor. In some embodiments, the scrambling seed extraction circuit 222 is a means for extracting a scrambling seed from encoded data prior to decoding the encode data. In one approach, the scrambling seed extraction circuit 222 obtains a candidate scrambling seed by extracting a portion of the encoded data 206 at a predetermined location. For example, the scrambling seed extraction circuit 222 extracts every eighth bit of the encoded data 206 or bits located at a particular column of the encoded data 206 as a candidate scrambling seed. The scrambling seed extraction circuit 222 may generate additional candidate scrambling seeds by modifying a candidate scrambling seed. For example, the scrambling seed extraction circuit 222 may vary one or more bits of a candidate scrambling seed to obtain additional candidate scrambling seeds. In another approach, the scrambling seed extraction circuit 222 obtains or determines a length of a scrambling seed (or a number of bits), and generates different combinations of candidate scrambling seeds according to the length. For example, the scrambling seed extraction circuit 222 determines that a scrambling seeds has 12 bits of data, and the scrambling seed extraction circuit 222 generates different combination of 12 bits of data as candidate scrambling seeds. The scrambling seed extraction circuit 222 may provide one or more candidate scrambling seeds to the descrambling circuit 224.

The descrambling circuit 224 is a circuit that descrambles the encoded data 206 using a candidate scrambling key (e.g., a candidate scrambling seed). The descrambling circuit 224 is coupled to the scrambling seed extraction circuit 222 and the receiver circuit 210. In other embodiments, a descrambler may be utilized in place of the descrambling circuit 224. As used herein, a descrambler may comprise any component, logic, circuit, or the like configured to descramble the encoded data 206 using a candidate scrambling key. In one embodiment, the descrambler includes the descrambling circuit 224. In another embodiment, two or more components may cooperate to serve as a descrambler. In some embodiments, the descrambling circuit 224 is a means for descrambling the encoded data according to the scrambling key. The descrambling circuit 224 receives a candidate scrambling key (e.g., a candidate scrambling seed) from the scrambling seed extraction circuit 222. The descrambling circuit 224 generates a scrambling sequence to descramble the encoded data 206 based on the candidate scrambling key, and descrambles the encoded data 206 according to the determined scrambling sequence. A scrambling sequence (also referred to as a "sequence" for descrambling) is a set of bits for scrambling or descrambling data. The descrambling circuit 224 may apply the candidate scrambling key to linear feedback shift register to obtain a set of bits as a scrambling sequence, and apply XOR operation on the encoded data with the scrambling sequence to obtain descrambled data. The descrambling circuit 224 provides, to the statistics analysis circuit 226, the descrambled data that is descrambled according to the candidate scrambling key.

The statistics analysis circuit 226 is a circuit that obtains one or more metrics for evaluating a candidate scrambling key (e.g., a candidate scrambling seed). The statistics analysis circuit 226 is coupled to the descrambling circuit 224 and the scrambling seed evaluation circuit 230. In other embodiments, a statistics analyzer may be utilized in place of the statistics analysis circuit 226. As used herein, a statistics analyzer may comprise any component, logic, circuit, or the like configured to review one or more metrics and to use those metrics to evaluate a candidate scrambling key. In one embodiment, the statistics analyzer includes the statistics analysis circuit 226. In another embodiment, two or more components may cooperate to serve as a statistics analyzer. In some embodiments, the statistics analysis circuit 226 is a means for obtaining statistics of the descrambled data. In one approach, the statistics analysis circuit 226 obtains one or more metrics indicative of performance or effectiveness of the candidate scrambling key. Examples of the metrics include statistical analysis of the descrambled data, entropy of descrambled data, etc. In one approach, the statistics analysis circuit 226 receives descrambled data from the descrambling circuit 224, and performs statistical analysis on the descrambled data to obtain one or more metrics of the candidate scrambling key. The statistics analysis circuit 226 provides the one or more metrics of the descrambled data to the scrambling seed evaluation circuit 230.

In one embodiment, the statistics analysis circuit 226 includes an entropy analysis circuit 228. The entropy analysis circuit 228, in one embodiment, is any circuit that determines entropy of data (including, for example, various candidate scrambling keys). The entropy analysis circuit 228 may determine entropy of descrambled data based on the statistical analysis of the descrambled data as a metric for evaluating a candidate scrambling key (e.g., a candidate scrambling seed). In one implementation, the entropy analysis circuit 228 divides the descrambled data into a plurality of segments, and obtains entropy of the descrambled based on the segments. The entropy analysis circuit 228 may modify a segment by subtracting its adjacent segments from the segment. The entropy analysis circuit 228 may obtain entropy according to a following equation:

$$H(X) = -\Sigma_{i=1}^{n} P(x_i) \log P(x_i) \qquad \text{Eq. (1)}.$$

where $x_i$ is a segment, $P(x_i)$ is a probability mass function for a corresponding segment, and $H(X)$ is entropy of the descrambled data. Beneficially, analyzing entropy of descrambled data allows determination of whether a scrambling key is effective or not. For example, a low entropy indicates a strong pattern of descrambled data, and high entropy indicates high randomness of descrambled data. Thus, a candidate scrambling key having low entropy is likely to be the scrambling key and is therefore selected as such. Moreover, a type of file of data may be determined based on the pattern from the entropy analysis, which allows a decoding to be performed in content aware manner based on the determined type of file. The entropy analysis circuit 228 provides the determined entropy of the descrambled data to the scrambling seed evaluation circuit 230.

The scrambling seed evaluation circuit 230 is a circuit that evaluates a plurality of candidate scrambling keys (e.g., candidate scrambling seeds). The scrambling seed evaluation circuit 230 is coupled to the descrambling circuit 224, the statistics analysis circuit 226, the decoding circuit 235 and the decoding configuration circuit 232. In other embodiments, a seed evaluator may be utilized in place of the scrambling seed evaluation circuit 230. The seed evaluator may comprise any component, logic, circuit, or the like configured to evaluate a plurality of candidate scrambling keys. In one embodiment, the seed evaluator includes the scrambling seed evaluation circuit 230. In another embodiment, two or more components may cooperate to serve as the seed evaluator. The scrambling seed evaluation circuit 230 receives metrics of different candidate scrambling keys, and compares the metrics to select a candidate scrambling key. In one example, the scrambling seed evaluation circuit 230 compares entropies of different descrambled data, and identifies descrambled data having the lowest entropy. The scrambling seed evaluation circuit 230 then selects a candidate scrambling key rendering the identified descrambled data having the lowest entropy as the scrambling key for descrambling. The scrambling seed evaluation circuit 230 may provide the identified descrambled data to the decoding circuit 235. The scrambling seed evaluation circuit 230 may also provide statistics (e.g., entropy, or distribution of patterns of descrambled data) of the identified descrambled data to the decoding configuration circuit 232.

The decoding configuration circuit 232 is a circuit that generates decoding configuration data for configuring the decoding circuit 235. The decoding configuration circuit 232 is coupled to the scrambling seed evaluation circuit 230 and the decoding circuit. The decoding configuration circuit 232 may receive statistics of descrambled data associated with the selected scrambling key for descrambling (e.g., the selected scrambling seed), and generate decoding configuration data according to the received statistics. In one aspect, the statistics of the descrambled data are indicative of content or a type of data encoded. The decoding configuration circuit 232 may determine a type of encoded data based on statistics of the descrambled data. For example, the decoding circuit 235 may determine whether the encoded data is a text file, an image file, an audio file, a movie file, etc., based on the statistics (e.g., entropy) of the descrambled data, and generate decoding configuration data according to the determined type of encoded data. The decoding configuration circuit 232 provides the decoding configuration data to the decoding circuit 235.

Figure 3A:
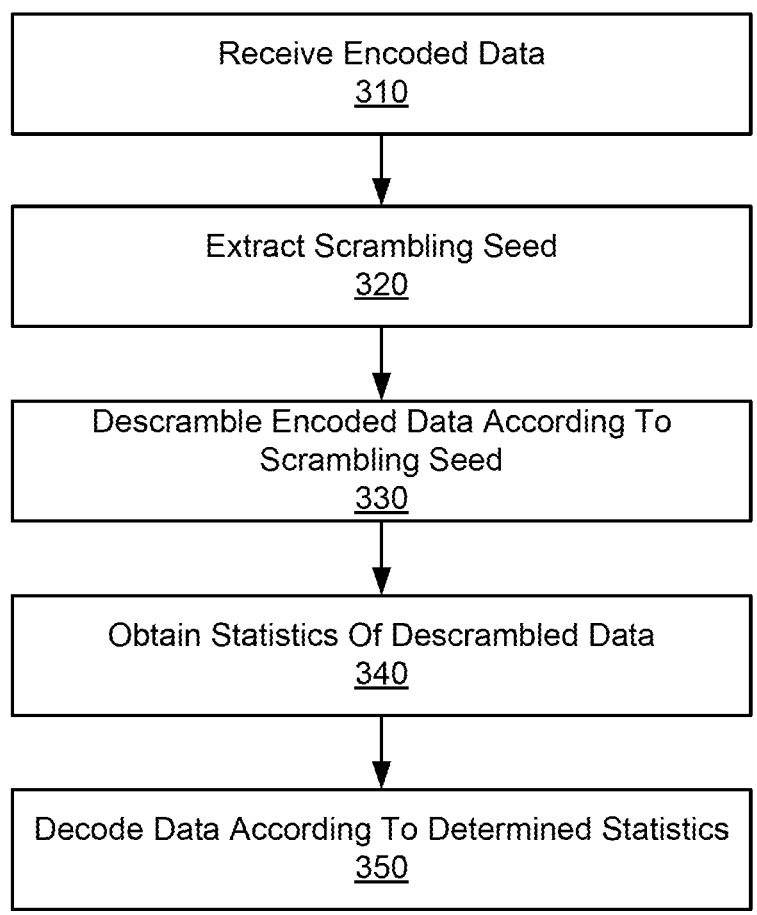
FIG. 3A is a flow chart illustrating a process of extracting a scrambling seed to descramble encoded data and decoding the descrambled data, according to an example embodiment.

FIG. 3A is a flow chart illustrating a process 300A of extracting a scrambling seed to descramble encoded data, and decoding the descrambled data, according to an example embodiment. The process 300A may be performed by the memory interface circuit 110 of FIG. 2. In other embodiments, the process 300A may be performed by other entities. In other embodiments, the process 300A includes more, fewer, or different operations than shown in FIG. 3A.

The memory interface circuit 110 receives encoded data 206 in operation 310. The memory interface circuit 110 may receive, from the host system 112, a request to read data, and an address signal 202 associated with one or more memory cells. The memory interface circuit 110 may retrieve encoded data 206 stored by memory cells associated with the address signal 202.

The memory interface circuit 110 extracts the scrambling seed from the encoded data 206 in operation 320. In one approach, the memory interface circuit 110 extracts the scrambling seed from the encoded data 206 without decoding the encoded data 206. The scrambling seed may be a candidate scrambling seed extracted from the encoded data 206. For example, the candidate scrambling seed may be a portion of the encoded data 206 located at a predetermined location. For another example, the candidate scrambling seed may be obtained by modifying one or more bits of another candidate scrambling seed.

The memory interface circuit 110 descrambles the encoded data 206 according to the scrambling seed in operation 330. The memory interface circuit 110 may determine a sequence of descrambling based on the selected candidate scrambling seed, and descramble the encoded data 206 according to the determined sequence of descrambling.

The memory interface circuit 110 obtains statistics of descrambled data in operation 340. The memory interface circuit 110 may obtain entropy or a distribution of patterns of descrambled data. The memory interface circuit 110 may generate decoding configuration data based on the statistics of the descrambled data. The decoding configuration data includes parameters for configuring how to perform decoding. For example, the memory interface circuit 110 determines a type of data encoded (e.g., a text file, an image file, an audio file, a movie file, etc.) based on the statistics (e.g., entropy) of the descrambled data, and generates the decoding configuration data according to the determined type.

In one aspect, the operations 320, 330, 340 may be performed together by evaluating multiple candidate scrambling keys (e.g., candidate scrambling seeds), and selecting a scrambling key for descrambling as described below with respect to FIG. 4.

The memory interface circuit 110 decodes the descrambled data in operation 350. The memory interface circuit 110 may decode the descrambled data according to the decoding configuration data. Because the decoding configuration data is generated according to statistics of the descrambled data indicative of content of encoded data, the memory interface circuit 110 may perform content aware decoding. The memory interface circuit 110 provides the decoded data to the host system 112.

Figure 3B:
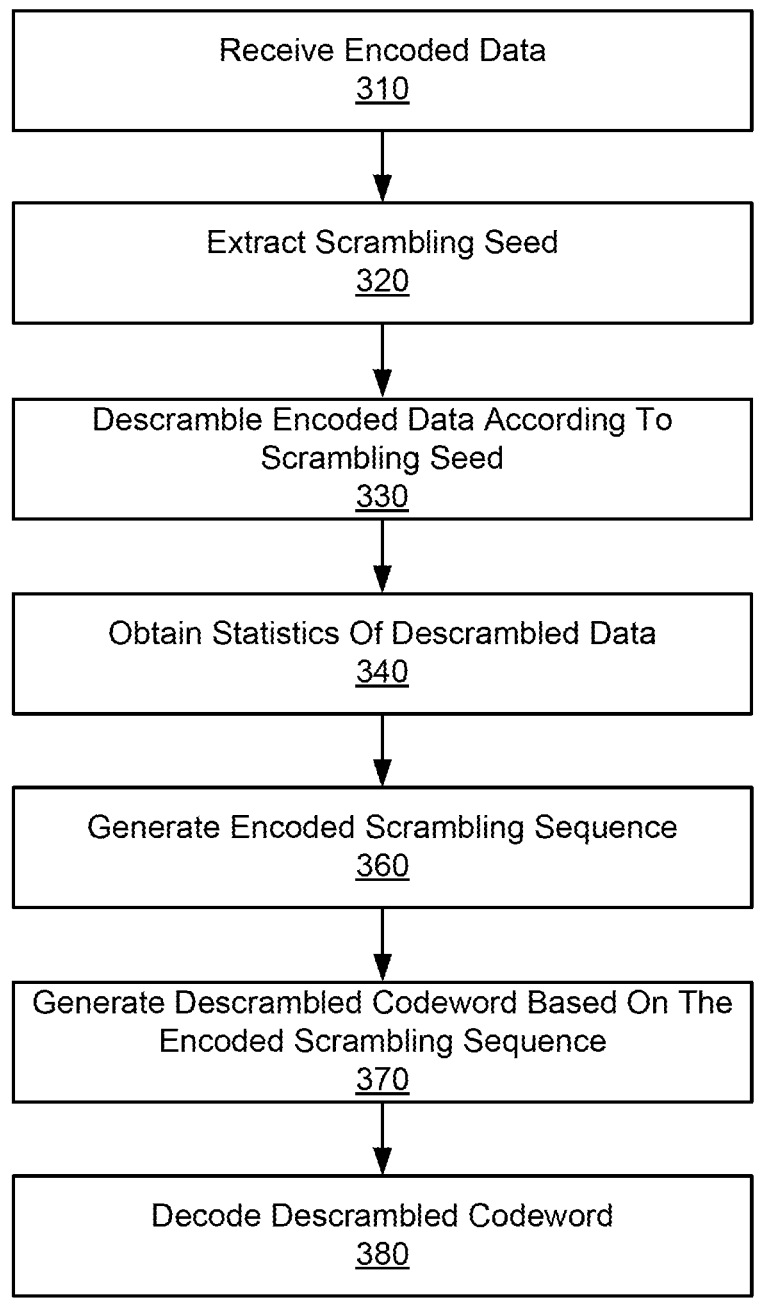
FIG. 3B is a flow chart illustrating a process of extracting a scrambling seed to determine decoding parameters and decoding the encoded data based on the decoding parameters, according to an example embodiment.

FIG. 3B is a flow chart illustrating a process 300B of extracting a scrambling seed to determine decoding parameters, and decoding the descrambled data based on the decoding parameters, according to an example embodiment. The process 300B may be performed by the memory interface circuit 110 of FIG. 2. In other embodiments, the process 300B may be performed by other entities. In other embodiments, the process 300B includes more, fewer, or different operations than shown in FIG. 3B.

The memory interface circuit 110 receives encoded data 206 in operation 310. The memory interface circuit 110 may receive, from the host system 112, a request to read data, and an address signal 202 associated with one or more memory cells. The memory interface circuit 110 may retrieve encoded data 206 stored by memory cells associated with the address signal 202.

The memory interface circuit 110 extracts the scrambling seed from the encoded data 206 in operation 320. In one approach, the memory interface circuit 110 extracts the scrambling seed from the encoded data 206 without decoding the encoded data 206. The scrambling seed may be a candidate scrambling seed extracted from the encoded data 206. For example, the candidate scrambling seed may be a portion of the encoded data 206 located at a predetermined location. For another example, the candidate scrambling seed may be obtained by modifying one or more bits of another candidate scrambling seed. The memory interface circuit 110 may extract the scrambling seed as described below with respect to FIG. 4.

The memory interface circuit 110 descrambles the encoded data 206 according to the scrambling seed in operation 330. The memory interface circuit 110 may determine a sequence of descrambling based on the selected candidate scrambling seed, and descramble the encoded data 206 according to the determined sequence of descrambling.

The memory interface circuit 110 obtains statistics of descrambled data in operation 340. The memory interface circuit 110 may obtain entropy or a distribution of patterns of descrambled data. The memory interface circuit 110 may generate decoding configuration data based on the statistics of the descrambled data. The decoding configuration data includes parameters for configuring how to perform decoding. For example, the memory interface circuit 110 determines a type of data encoded (e.g., a text file, an image file, an audio file, a movie file, etc.) based on the statistics of the descrambled data, and generates the decoding configuration data according to the determined type.

The memory interface circuit 110 generates an encoded scrambling sequence according to the selected candidate scrambling seed in operation 360. The memory interface circuit 110 may scramble a predetermined data (e.g., all zero) according to the candidate scrambling seed, append the scrambling seed as metadata to the scrambled predetermined data, then encode the scrambled predetermined data with the appended scrambling seed to obtain the encoded scrambling sequence.

The memory interface circuit 110 generates a descrambled codeword based on the encoded scrambling sequence. The memory interface circuit 110 may perform XOR operation on the encoded data received in the operation 310 with the encoded scrambling sequence obtained in the operation 360 to obtain de-scrambled codeword.

The memory interface circuit 110 decodes the descrambled codeword in operation 380. The memory interface circuit 110 may decode the descrambled codeword according to the decoding configuration data. Because the decoding configuration data is generated according to statistics of the descrambled data indicative of content of encoded data, the memory interface circuit 110 may perform content aware decoding. The memory interface circuit 110 provides the decoded data to the host system 112.

Figure 4:
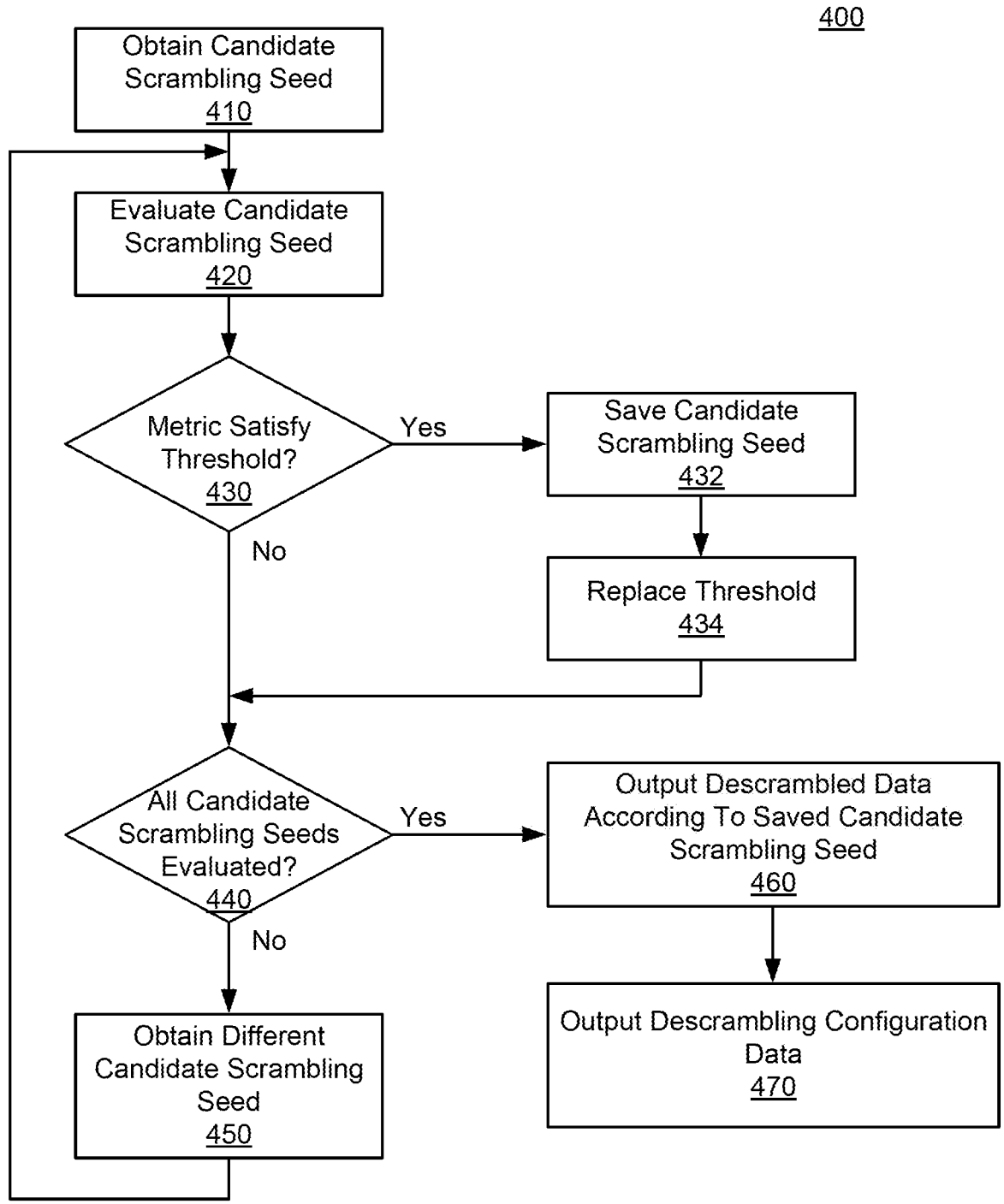
FIG. 4 is a flow chart illustrating a process of extracting a scrambling seed, according to an example embodiment.

FIG. 4 is a flow chart illustrating a process 400 of extracting a scrambling seed, according to an example embodiment. The process 400 may be performed by the adaptive decoding controller 220 of FIG. 2. In other embodiments, the process 400 may be performed by other entities. In other embodiments, the process 400 includes more, fewer, or different operations than shown in FIG. 4.

The adaptive decoding controller 220 obtains a candidate scrambling seed in operation 410. The adaptive decoding controller 220 may obtain a candidate scrambling seed from a plurality of candidate scrambling seeds. A candidate scrambling seed is a scrambling seed that may have been applied to scramble data. The adaptive decoding controller 220 may obtain a candidate scrambling seed by extracting a portion of the encoded data 206 at a predetermined location (e.g., bits located at a particular column or every eights bits, etc.). The adaptive decoding controller 220 may also obtain a candidate scrambling seed by modifying one or more bits of another candidate scrambling seed.

The adaptive decoding controller 220 evaluates the candidate scrambling seed in operation 420. In one approach, the adaptive decoding controller 220 obtains one or more metrics indicative of performance or effectiveness of the candidate scrambling seed. Examples of metrics of a candidate scrambling seed include entropy or statistics of descrambled data that is obtained by descrambling the encoded data 206 according to the scrambling seed. The adaptive decoding controller 220 may descramble the encoded data 206 according to the candidate scrambling seed, and perform statistical analysis on the descrambled data or obtain entropy of the descrambled data.

The adaptive decoding controller 220 determines whether one or more metrics satisfy a corresponding threshold in operation 430. The threshold may be predetermined or updated by the adaptive decoding controller 220. If the metrics satisfy the threshold (e.g., entropy of descrambled data is lower than the threshold), then the adaptive decoding controller 220 saves the candidate scrambling seed in operation 432, and replaces the threshold in operation 434. The adaptive decoding controller 220 may replace the threshold with the entropy of descrambled data that is obtained by descrambling the encoded data 206 according to the saved candidate scrambling seed. The updated threshold may be compared against entropy of different descrambled data that is obtained by descrambling the encoded data 206 according to another candidate scrambling seed.

After replacing the threshold in the operation 434 or in response to determining that the one or more metrics do not satisfy the threshold, the adaptive decoding controller 220 determines whether all candidate scrambling seeds have been evaluated in operation 440. If not all candidate scrambling seeds have been evaluated, then the adaptive decoding controller 220 obtains a different candidate scrambling seed in operation 450, and evaluates the different candidate scrambling seed in the operation 420.

If all candidate scrambling seeds have been evaluated, the adaptive decoding controller 220 outputs descrambled data to the decoding circuit 235 of FIG. 2. The adaptive decoding controller 220 may output the descrambled data that is obtained by descrambling the encoded data 206 according to the saved candidate scrambling seed in operation 460. The adaptive decoding controller 220 may also generate decoding configuration data, according to statistics of the descrambled data, and output the configuration data to the decoding circuit 235 in operation 470. The adaptive decoding controller 220 may generate the decoding configuration data, for example, according to a type of encoded data (e.g., a text file, an image file, an audio file, a movie file, etc.) indicated by the statistics of the descrambled data.

Figure 5A:
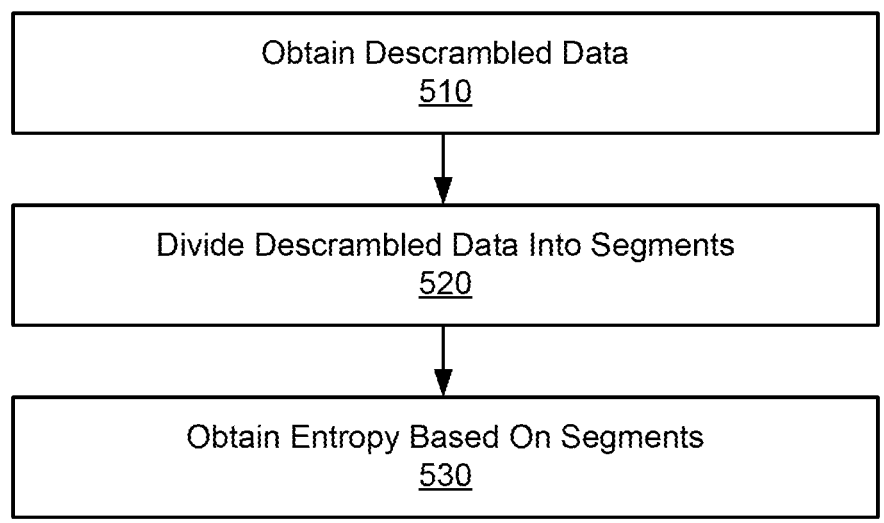
FIG. 5A is a flow chart illustrating a process of evaluating a candidate scrambling seed, according to an example embodiment.

FIG. 5A is a flow chart illustrating a process 500A of evaluating a candidate scrambling seed, according to an example embodiment. The process 500A may be performed by the entropy analysis circuit 228 of FIG. 2. In other embodiments, the process 500A may be performed by other entities. In other embodiments, the process 500 includes more, fewer, or different operations than shown in FIG. 5A.

The entropy analysis circuit 228 obtains descrambled data in operation 510. The descrambled data may be obtained by descrambling the encoded data 206 according to a candidate scrambling seed.

The entropy analysis circuit 228 divides the descrambled data into segments in operation 520. The descrambled data may be divided into bytes, where each byte may have 8 bits.

The entropy analysis circuit 228 obtains entropy based on the segments in operation 530. For example, the entropy analysis circuit 228 obtains the entropy of the descrambled data according to the Eq. (1) above. The entropy of the descrambled data may be evaluated to determine or select a scrambling seed from a plurality of candidate scrambling seeds.

Figure 5B:
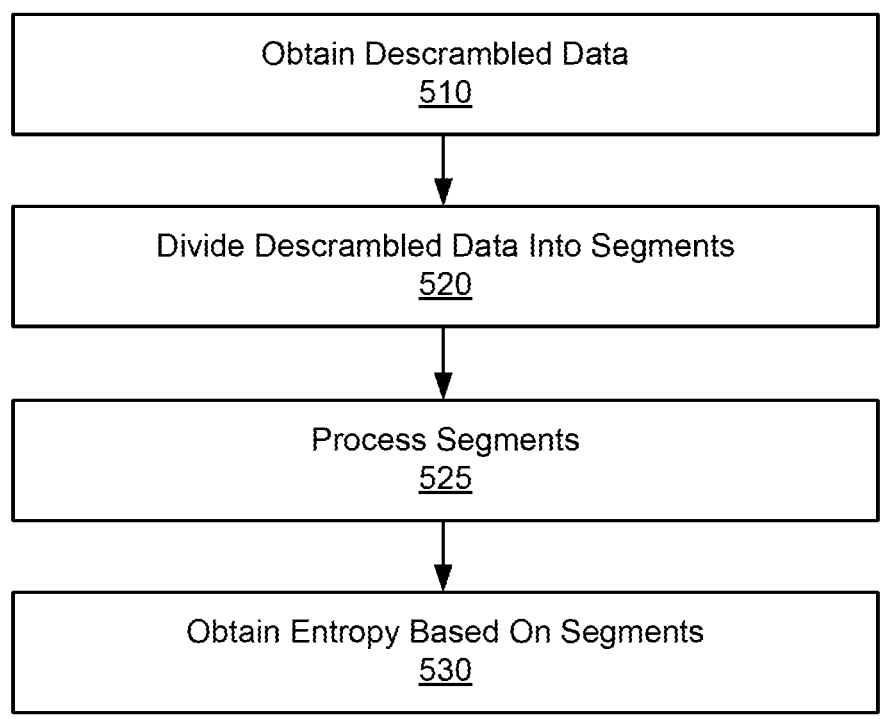
FIG. 5B is a flow chart illustrating a process of evaluating a candidate scrambling seed, according to another example embodiment.

FIG. 5B is a flow chart illustrating a process 500B of evaluating a candidate scrambling seed, according to another example embodiment. The process 500B may be performed by the entropy analysis circuit 228 of FIG. 2. The process 500B is similar to the process 500A in FIG. 5A, except an additional operation 525 is added between the operation 520 and the operation 530. Thus, duplicative descriptions thereof are omitted herein for the sake of brevity.

In the operation 525 segments may be processed prior to obtaining the entropy. The segments may be processed to remove a particular pattern in content of the data, rather than a type of content. For example, a text file may include numbers or counter values in an ascending order (e.g., '1, 2, 3, 4 . . . 256') as its content. In this example, entropy of the text file may be high, despite a particular pattern in the content. In one approach, a segment is processed by subtracting the segment by its adjacent segments. By processing the segments, a particular pattern attributing to high entropy may be reduced, allowing entropy obtained based on the processed segments to better reflect a type of content despite any particular pattern in the content.

Figure 6B:
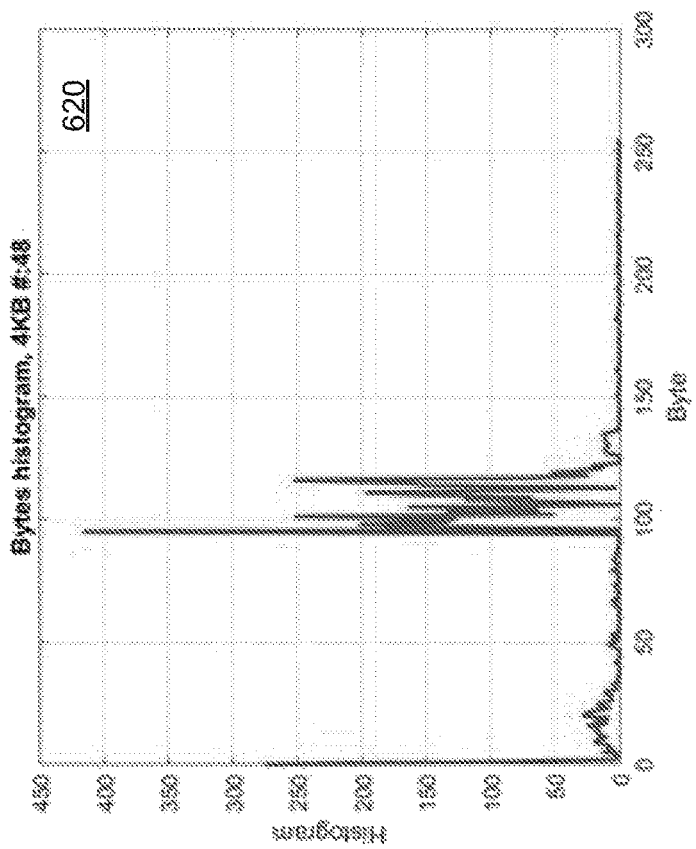
FIGS. 6A through 6E are example patterns of different data, according to another example embodiment.
Figure 6A:
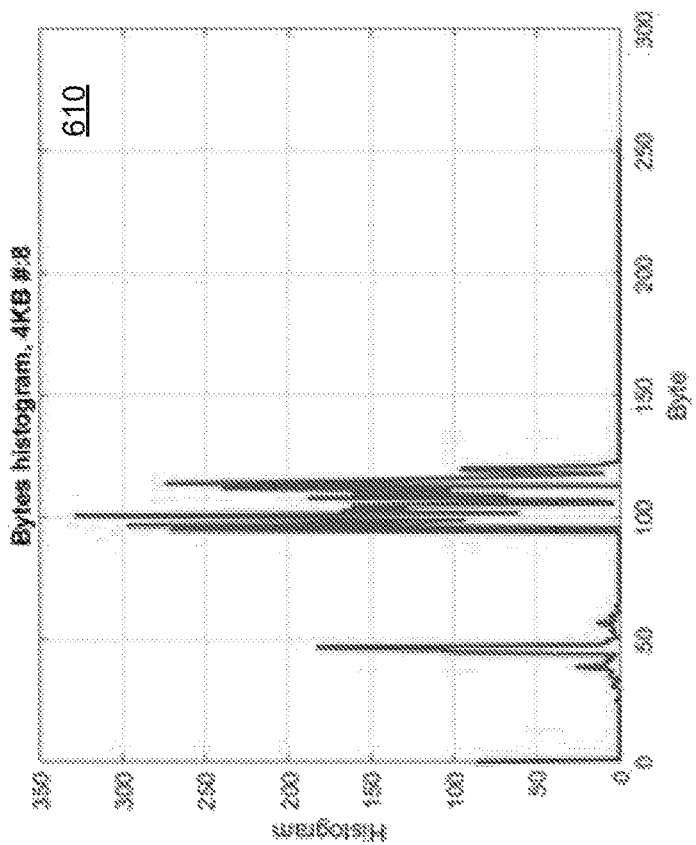
Figures 6C, 6D:
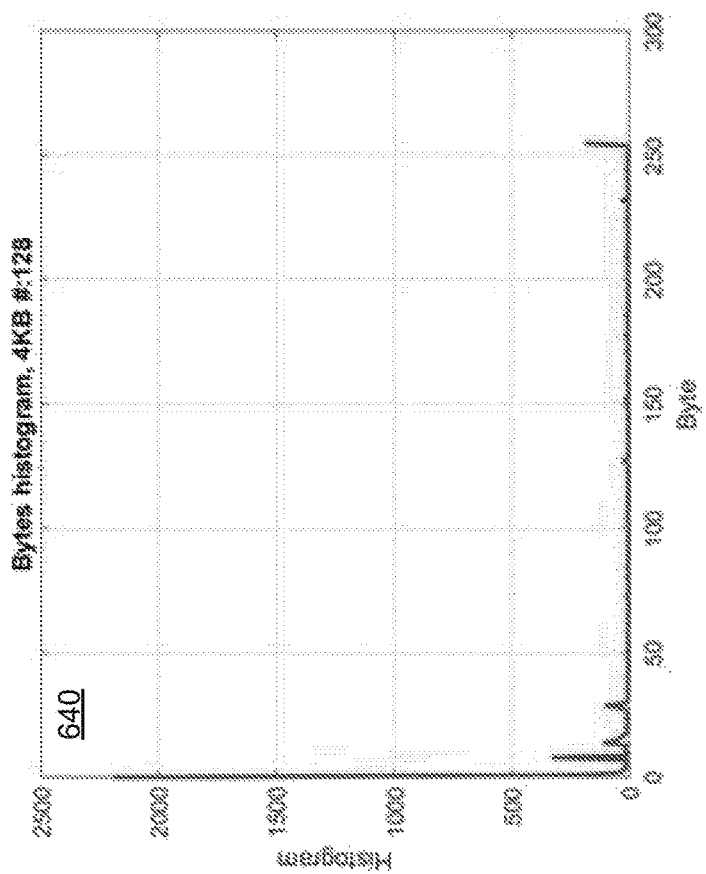
Figure 6E:
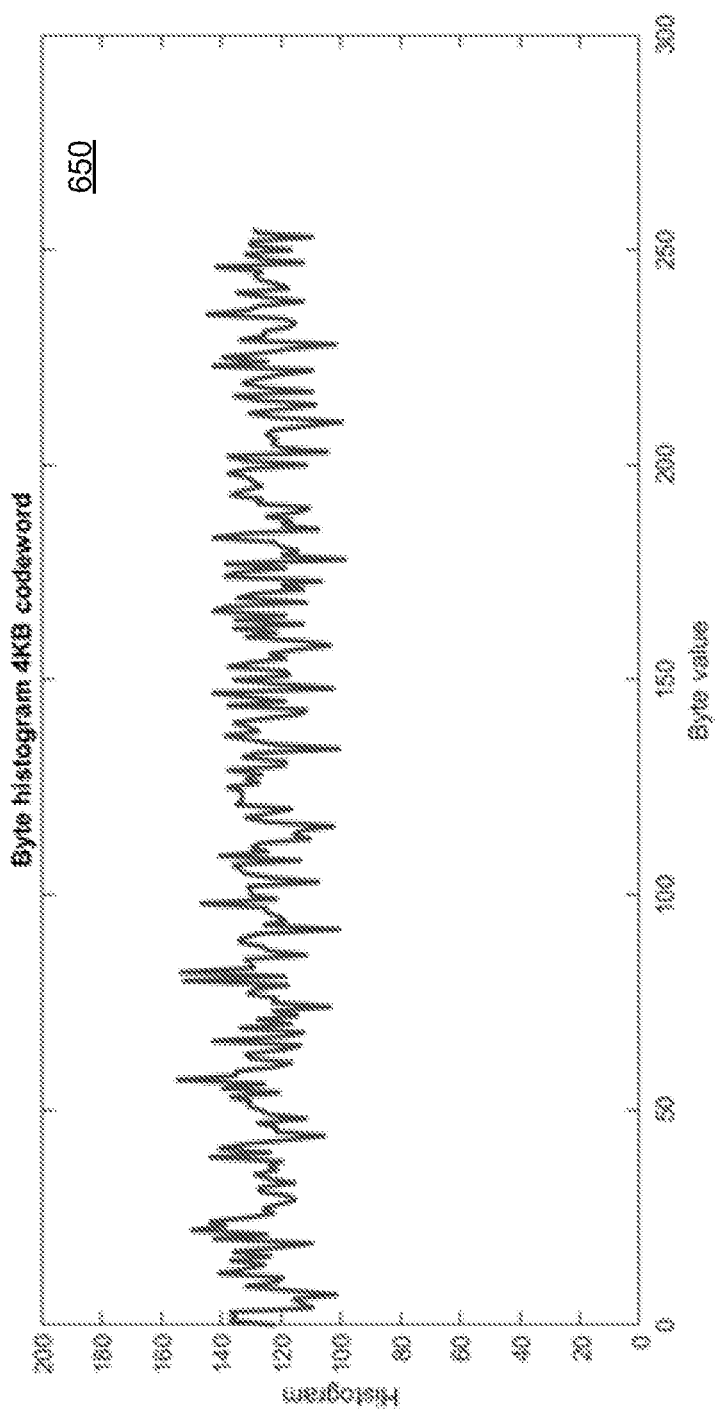

FIGS. 6A through 6E are example patterns 610-650 of different data, according to another example embodiment. The patterns 610-650 may be obtained based on entropy analysis of descrambled data. Specifically, FIGS. 6A through 6D show distributions of patterns 610-640 of descrambled data of different files (e.g., a text file, an image file, an audio file, a movie file, etc.). As shown in FIGS. 6A through 6D, different types of files may have different patterns 610-640 of descrambled data. FIG. 6E shows a distribution of pattern 650 of random data. Generally, correct scrambling seed renders descrambled data to manifest a strong pattern (or low randomness) as shown in FIGS. 6A through 6D, where incorrect scrambling seeds render the descramble data to be random (or white noise) as shown in FIG. 6E. Descrambled data with a low randomness has lower entropy than random data. Thus, the adaptive decoding controller 220 (e.g., the scrambling seed evaluation circuit 230) of FIG. 2 may compare entropy of different descrambled data, and select a candidate scrambling seed rendering descrambled data having the lowest entropy as the scrambling seed without decoding the encoded data 206. Moreover, the adaptive decoding controller 220 (e.g., decoding configuration circuit 232) may determine a type of content of the encoded data based on the distribution of patterns of descrambled data, and generate decoding configuration data according to the determined type of content.

The preceding description is directed to certain implementations for the purposes of describing the innovative aspects of this disclosure. However, a person having ordinary skill in the art will readily recognize that the teachings herein can be applied in a multitude of different ways. The described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, wearable devices, clocks, calculators, television monitors, flat panel displays, electronic reading devices (such as e-readers), computer monitors, auto displays (such as odometer and speedometer displays), cockpit controls and displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, in addition to non-EMS applications), aesthetic structures (such as display of images on a piece of jewelry or clothing) and a variety of EMS devices.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, directional terms are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A device comprising:
   a receiver configured to receive encoded data;
   an adaptive decoding controller configured to:
     obtain a plurality of candidate scrambling seeds from the encoded data,
     descramble the encoded data using the plurality of candidate scrambling seeds,
     evaluate the plurality of candidate scrambling seeds according to descrambled data, and
     select a scrambling seed from the plurality of candidate scrambling seeds; and
   a decoder configured to decode the descrambled data obtained from descrambling according to the scrambling seed.

2. The device of claim 1, wherein the adaptive decoding controller is configured to obtain the scrambling seed directly from the encoded data without decoding the encoded data.

3. The device of claim 1, wherein the adaptive decoding controller is configured to:

obtain statistics of the descrambled data, and wherein the decoder is configured to decode the descrambled data based on the statistics of the descrambled data.

4. The device of claim 1, wherein the adaptive decoding controller is further configured to:

evaluate the scrambling seed based on one or more metrics, the one or more metrics including an entropy of descrambled data, and select the scrambling seed based on an evaluation of the one or more metrics.

5. The device of claim 1, wherein the adaptive decoding controller is configured to:

obtain a first candidate scrambling seed and a second candidate scrambling seed from the encoded data, the scrambling seed being one of the first candidate scrambling seed and the second candidate scrambling seed, descramble the encoded data based on the first candidate scrambling seed to obtain first descrambled data, and descramble the encoded data based on the second candidate scrambling seed to obtain second descrambled data.

6. The device of claim 5, wherein the adaptive decoding controller is configured to:

compare the first descrambled data and the second descrambled data, and select one of the first candidate scrambling seed and the second candidate scrambling seed as the scrambling seed based on the comparison.

7. The device of claim 5, wherein the adaptive decoding controller is configured to:

obtain a first entropy of the first descrambled data, obtain a second entropy of the second descrambled data, compare the first entropy and the second entropy, and select the one of the first candidate scrambling seed and the second candidate scrambling seed rendering the descrambled data having a lower entropy as the scrambling seed.

8. A system comprising:

an extraction circuit configured to extract a scrambling key from encoded data, the scrambling key indicating a candidate scrambling sequence for scrambling of data in the encoded data;

a descrambling circuit configured to descramble the encoded data;

an entropy analysis circuit coupled to the descrambling circuit, the entropy analysis circuit configured to obtain an entropy of the descrambled data;

a scrambling seed evaluation circuit coupled to the entropy analysis circuit, the scrambling seed evaluation circuit configured to evaluate the scrambling key indicating the candidate scrambling sequence for scrambling of the data in the encoded data, according to the entropy of the descrambled data, to determine an effectiveness of the scrambling key; and a decoding circuit coupled to the scrambling seed evaluation circuit, the decoding circuit configured to decode the descrambled data based on the determined scrambling key.

9. The system of claim 8, wherein the extraction circuit is configured to extract the scrambling key located at a predetermined location in the encoded data.

10. The system of claim 8, wherein the extraction circuit is configured to obtain the scrambling key by changing one or more bits of another candidate scrambling key.

11. The system of claim 8, wherein the scrambling seed evaluation circuit is further configured to determine whether the entropy of the descrambled data satisfies a threshold entropy, wherein, in response to determining that the entropy of the descrambled data satisfies the threshold entropy, the entropy analysis circuit is further configured to update the entropy of the descrambled data to be the threshold entropy, and wherein the extraction circuit is further configured to obtain another scrambling key.

12. The system of claim 8, wherein the scrambling seed evaluation circuit is configured to determine whether the entropy of the descrambled data satisfies a threshold entropy, and wherein the extraction circuit is further configured to obtain another scrambling key, in response to detecting the entropy of the descrambled data does not satisfy the threshold entropy.

13. The system of claim 8, wherein the decoding circuit is further configured to decode the descrambled data, in response to the scrambling seed evaluation circuit determining that the descrambled data descrambled according to the scrambling key has a lowest entropy from a set of descrambled data descrambled according to a plurality of scrambling keys.

14. A system comprising:

a plurality of memory cells storing encoded data; and a memory interface circuit coupled to the plurality of memory cells, the memory interface circuit including:

a receiver coupled to the plurality of memory cells, the receiver configured to receive the encoded data from the plurality of memory cells, an adaptive decoding controller coupled to the receiver, the adaptive decoding controller configured to:

select, from a plurality of candidate scrambling seeds, according to entropy of data descrambled using the plurality of candidate scrambling seeds, a scrambling seed rendering descrambled data having a lower entropy than other candidate scrambling seeds, and descramble the encoded data according to the selected scrambling seed, and a decoder configured to decode the descrambled data descrambled according to the selected scrambling seed.

15. The system of claim 14, wherein the adaptive decoding controller includes:

a statistics analyzer coupled to the descrambler, the statistics analyzer configured to determine statistics of the descrambled data, wherein the decoder is configured to decode the descrambled data according to the determined statistics of the descrambled data.

16. The system of claim 15, wherein the statistics analyzer is configured to obtain a plurality of entropies of descrambled data obtained by descrambling the encoded data according to a plurality of candidate scrambling seeds, and wherein the adaptive decoding controller includes:

a seed evaluator coupled to the statistics analyzer, the seed evaluator configured to:

compare the plurality of entropies, and select the scrambling seed from the plurality of candidate scrambling seeds rendering a lowest entropy of the plurality of entropies.

17. The system of claim 14, wherein the plurality of candidate scrambling seeds includes at least a first candidate scrambling seed and a second candidate scrambling seed,
wherein the adaptive decoding controller includes a scrambling seed extractor coupled to the receiver, the scrambling seed extractor configured to:
extract a first candidate scrambling seed located at a predetermined location in the encoded data, and
obtain a second candidate scrambling seed by changing one or more bits of the first candidate scrambling seed.

18. The system of claim 14, wherein the adaptive decoding controller includes:
a scrambling seed extractor coupled to the receiver, the scrambling seed extractor configured to obtain a first candidate scrambling seed and a second candidate scrambling seed from the encoded data of the plurality of candidate scrambling seeds, and
a descrambler coupled to the scrambling seed extractor, the descrambler configured to:
descramble the encoded data based on the first candidate scrambling seed to obtain first descrambled data, and
descramble the encoded data based on the second candidate scrambling seed to obtain second descrambled data.

19. A method comprising:
extracting a scrambling seed from encoded data prior to decoding the encoded data;
descrambling the encoded data according to the scrambling seed;
obtaining statistics of the descrambled data that are indicative of a type of data in the encoded data; and
decoding the descrambled data according to the type of data.

20. The method of claim 19, further comprising:
descrambling the encoded data based on a first candidate scrambling seed to obtain a first descrambled data;
descrambling the encoded data based on a second candidate scrambling seed to obtain a second descrambled data;
comparing the first descrambled data and the second descrambled data; and
selecting one of the first candidate scrambling seed and the second candidate scrambling seed as the scrambling seed based on the comparison.

21. A system comprising:
an extracting circuit configured to extract a scrambling seed from encoded data prior to decoding the encode data;
a descrambling circuit configured to descramble the encoded data according to the scrambling seed;
a statistics and analysis circuit configured to obtain statistics of the descrambled data; and
a decoding circuit configured to decode the descrambled data according to the statistics of the descrambled data.

* * * * *